United States Patent [19]
Lawandy

[11] Patent Number: 5,919,607
[45] Date of Patent: Jul. 6, 1999

[54] PHOTO-ENCODED SELECTIVE ETCHING FOR GLASS BASED MICROTECHNOLOGY APPLICATIONS

[75] Inventor: Nabil M Lawandy, North Kingston, R.I.

[73] Assignee: Brown University Research Foundation, Providence, R.I.

[21] Appl. No.: 08/731,565

[22] Filed: Oct. 16, 1996

Related U.S. Application Data

[60] Provisional application No. 60/005,973, Oct. 26, 1995.

[51] Int. Cl.$^6$ .................................. G11B 7/00; G03C 5/00
[52] U.S. Cl. ............................ 430/326; 430/5; 430/321; 216/24
[58] Field of Search .................... 216/87, 55, 53, 216/24; 430/5, 321, 326

[56] References Cited

U.S. PATENT DOCUMENTS

| | | | |
|---|---|---|---|
| 3,586,816 | 6/1971 | Hagen | 219/121 |
| 3,689,264 | 9/1972 | Chandross et al. | 96/35.1 |
| 3,948,660 | 4/1976 | Deml et al. | 96/38.3 |
| 4,439,245 | 3/1984 | Wu | 148/1.5 |
| 4,478,768 | 10/1984 | Takeoka et al. | 264/1.4 |
| 4,530,734 | 7/1985 | Klima | 156/628 |
| 4,725,561 | 2/1988 | Haond et al. | 437/62 |
| 4,729,641 | 3/1988 | Matsuoka | 359/43 |
| 4,734,729 | 3/1988 | Hertzel et al. | 354/304 |
| 4,775,967 | 10/1988 | Shimada | 369/44.39 |
| 4,826,292 | 5/1989 | Spohr et al. | 350/321 |
| 4,832,997 | 5/1989 | Balanzat et al. | 428/131 |
| 4,838,989 | 6/1989 | Asbby et al. | 156/628 |
| 4,842,782 | 6/1989 | Portney et al. | 264/1.4 |
| 4,899,048 | 2/1990 | Shelander | 250/231 SE |
| 5,053,171 | 10/1991 | Portney et al. | 264/1.4 |
| 5,148,322 | 9/1992 | Aoyama et al. | 359/708 |
| 5,201,989 | 4/1993 | Douglas et al. | 156/635 |
| 5,208,698 | 5/1993 | Muller | 359/299 |
| 5,238,529 | 8/1993 | Douglas | 156/635 |
| 5,260,826 | 11/1993 | Wu | 359/368 |
| 5,271,797 | 12/1993 | Kamisawa | 156/635 |
| 5,279,703 | 1/1994 | Haberger et al. | 56/635 |
| 5,294,518 | 3/1994 | Brady et al. | 430/290 |
| 5,312,516 | 5/1994 | Douglas et al. | 156/635 |
| 5,491,762 | 2/1996 | Deacon | 385/16 |
| 5,500,869 | 3/1996 | Yoshida et al. | 372/50 |

FOREIGN PATENT DOCUMENTS

| | | |
|---|---|---|
| 1252306 A1 | 8/1986 | U.S.S.R. . |
| 2 233 334 | 9/1991 | United Kingdom . |

OTHER PUBLICATIONS

Petr A. Skiba et al., "Laser–stimulated local change of glass–ceramic optical properties", Optical Engineering, vol. 33, No. 11, Nov. 1994.

"The topography of laser–irrudiated germanium", D.C. Emmony et al., Journal of Physics D; Applied Physics, vol. 8, 1975, pp. 1472–1480.

"Binary Optics", W. Veldkamp and Thomas J. McHugh, Scientific American, May 1992, pp. 92–97.

S.S. Lee et al., "An 8x1 Micromachined Micro–fresnel Lans Array For Free–Space Optical Interconnection", Leos 1994 Conference Proceedings, vol. 1, 1994, pp. 242–243.

W.R. Cox et al., "Microjet Fabrication of Micro–Optical Components", LEOS '94 Conference Proceedings, vol. 1, 1994, pp. 52–53.

Z.L. Liau et al., "Mass–Transport Efficient Microlenses in GaAs and GaP for Integration with High Power Diode Lasers", LEOS '94 Conference Proceedings, vol. 1, 1994, pp.67–68.

B.F. Aull et al., "Application of Smart–Pixel and Microlens Arrays to Early Vision", LEOS '94 Conference Proceedings, vol. 1, 1994, pp. 149–150.

*Primary Examiner*—John M. Ford
*Assistant Examiner*—Pavanaram K Sripada
*Attorney, Agent, or Firm*—Perman & Green, LLP

[57] ABSTRACT

Two-photon excitation of charge carriers in boron E'-center containing borosilicate glasses is shown to result in a photo-encoding of selectively etchable regions. Using a turbulent process followed by polishing, a number of patterning capabilities for microtechnology applications are achieved, such as ultra-fast capillary electrophoresis chips and rapid prototyping of diffractive optical elements.

50 Claims, 11 Drawing Sheets

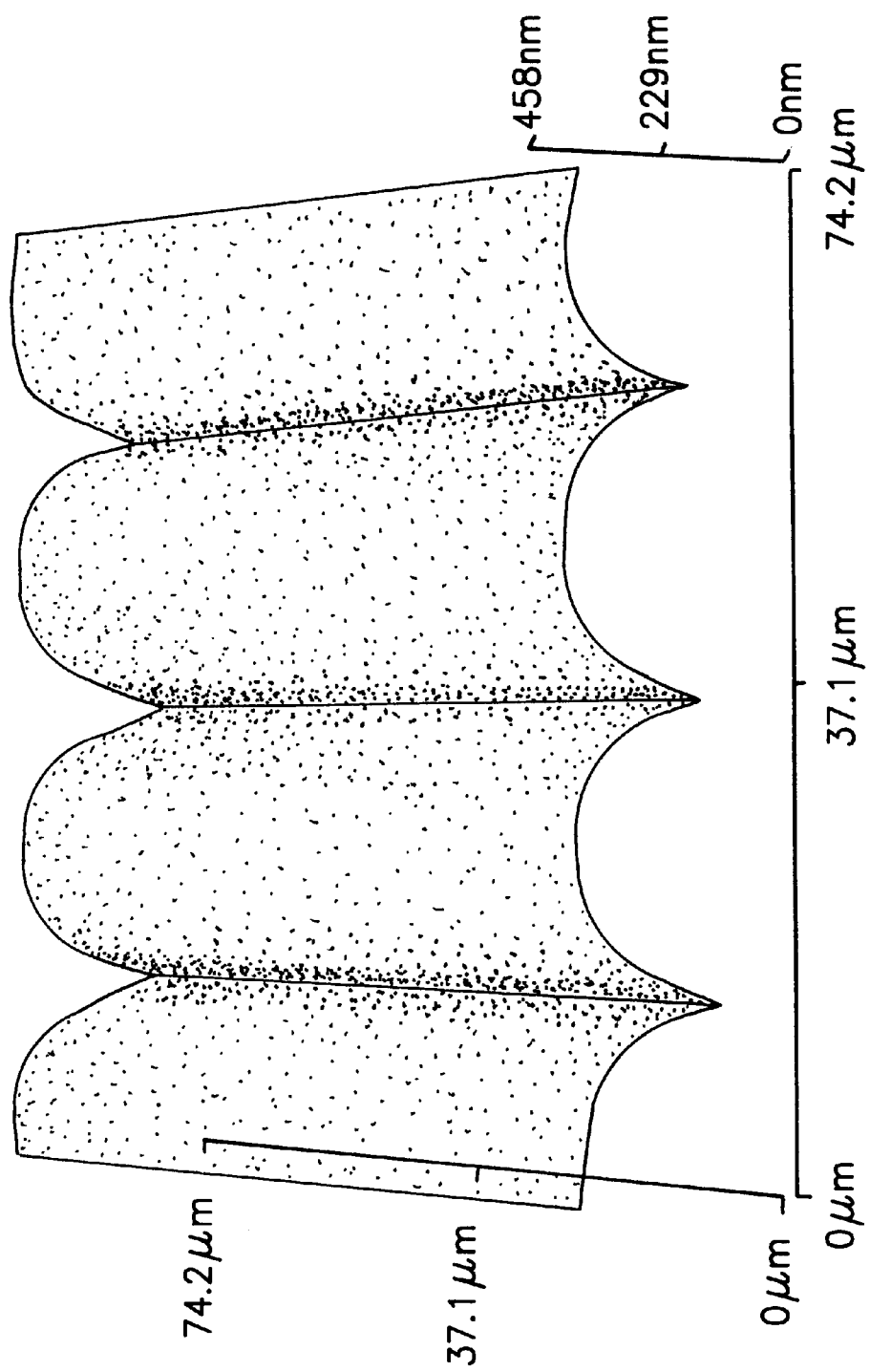

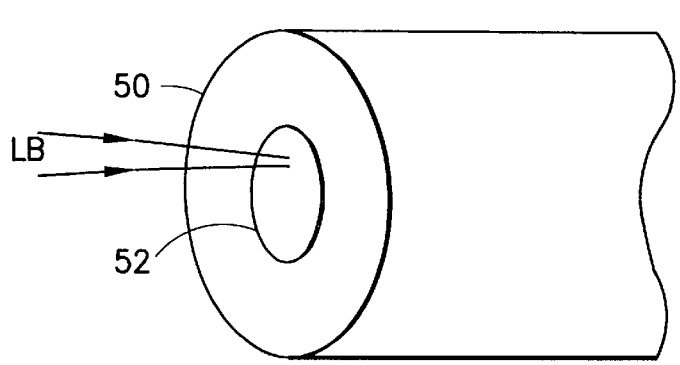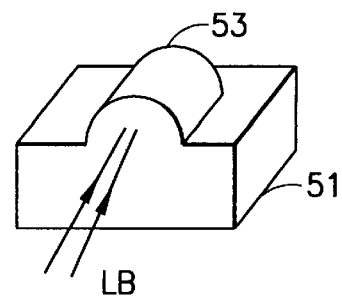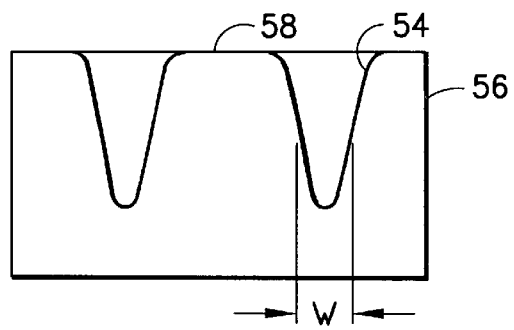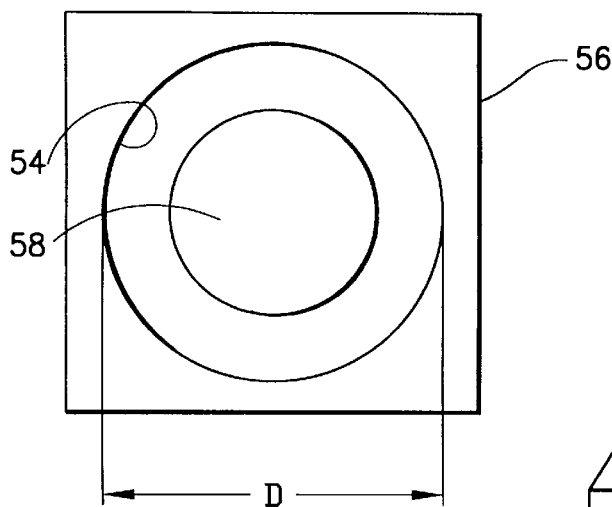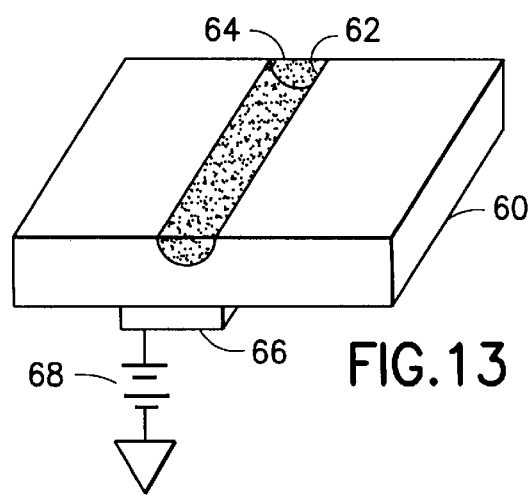

PHOTO-ENCODED SELECTIVE ETCHING FOR GLASS BASED MICROTECHNOLOGY APPLICATIONS

CLAIM OF PRIORITY FROM A COPENDING PROVISIONAL PATENT APPLICATION

Priority is herewith claimed under 35 U.S.C. §119(e) from copending Provisional Patent Application 60/005,973, filed Oct. 26, 1995, entitled "Photo-Encoded Selective Etching for Glass Based Microtechnology Applications", by Nabil M. Lawandy. The disclosure of this Provisional Patent Application is incorporated by reference herein in its entirety.

STATEMENT OF GOVERNMENT INTEREST

This invention was made with Government support under Contract No. F49620-94-1-0013 awarded by the Air Force Office of Scientific Research. The Government has certain rights in this invention.

FIELD OF THE INVENTION

This invention relates generally to glass-based processing methods and apparatus and, in particular, to methods and apparatus for patterning and etching glass-based materials.

BACKGROUND OF THE INVENTION

In recent years there has been in increased demand for further miniaturization of electronics, machines, and optics. By example, the development of integrated optics, diffractive optics, waveguides and, more recently, capillary electrophoresis chips for faster DNA sequencing, all require improved, faster, and more flexible methods for manufacturing small (e.g., micron-scale) devices. One of the more commonly used media for patterning in microelectronic, optoelectronic, and micromachine applications is silicon dioxide. Currently, photolithographic techniques are used primarily to pattern silicon dioxide. One major drawback to photolithography is the numerous steps that are necessary to pattern the surface. For example, direct exposure of lithium dioxide/silicon dioxide glasses to 245-nm light and subsequent baking procedures are required for local devitrification. The exposed areas can then be selectively etched, permitting the production of features of the order of several tens of micrometers. Direct exposure of glass to high-energy ion beams and electron beams has also been shown to lead to an increased etching rate in the exposed area and has been proposed as a potential patterning technique.

One way of circumventing some of the required steps of photolithography is to use photo-sensitive glasses, such as one known as Foturan™ that is available from Schott Corporation, Yonkers, N.Y. This is an alkali-aluminosilicate based glass that is doped with metallic ions (silver), and which is sensitive to wavelengths between 280–340 nm (UV). The material is irradiated with UV, then baked, and then etched. During baking the metal ions nucleate within the irradiated regions. During the subsequent etching process the portions of the material that contain the nucleated metal etches at a different rate than the remainder of the material.

While such glasses may improve the flexibility of patterning structures onto glass, they suffer from low resolution limitations, with minimum feature sizes of about 25 $\mu$m and a surface roughness of 1 to 3 $\mu$m. In addition, and although the number of steps required to produce the features are reduced as compared to photolithography, before etching the material requires baking at high temperatures (400–600° C.) for a significant period of time (e.g., one hour).

In general, conventional techniques present several drawbacks, including a lack of resolution required to accurately delineate and fabricate micron-scale structures, and excessive process complexity and/or processing times.

OBJECTS OF THE INVENTION

It is a first object of this invention to provide improved methods and apparatus for delineating and fabricating micron-scale structures into a glass-based substrate.

It is a second object of this invention to provide methods and apparatus enabling a direct writing of desired features into a glass-based substrate, and a method for etching the features into corresponding three-dimensional structures.

SUMMARY OF THE INVENTION

The foregoing and other problems are overcome and the objects of the invention are realized by methods and apparatus in accordance with embodiments of this invention. A method in accordance with this invention for selectively removing material from a substrate includes the following steps.

A first step provides a substrate comprised of a material that is capable of trapping charge carriers at sites in response to illumination with electromagnetic radiation having wavelengths within a predetermined range of wavelengths. A borosilicate glass is one presently preferred embodiment of a material, but the teaching of this invention is not limited to only this one glass.

A second step selectively illuminates at least one portion of a surface of the substrate whereat it is desired to remove a portion of the material. The step of selectively illuminating includes the steps of generating electromagnetic radiation having wavelengths within a predetermined range of wavelengths, and directing the generated electromagnetic radiation to the at least one portion of the surface.

A third step applies an etchant to the surface for removing the material within the selectively illuminated portion. In a presently preferred embodiment of this invention the step of applying an etchant includes the steps of immersing the substrate in an ultrasonically agitated acid bath, and rotating the substrate during a time that the substrate is immersed. This technique is referred to herein as a spin-agitated etching (SAE) treatment.

A fourth (optional) step of the method polishes the surface to remove surface roughness.

Further in accordance with the method of this invention the substrate may be sliced in a direction generally parallel to the surface to provide at least two thinner substrates; and the etchant is applied to at least one surface of each of the at least two thinner substrates.

In a first embodiment of this invention the step of generating electromagnetic radiation generates a focussed beam of electromagnetic radiation, and the step of directing the generated electromagnetic radiation includes a step of causing a relative motion between the surface and the focussed beam.

In a second embodiment of this invention the step of generating electromagnetic radiation generates a focussed linear beam of electromagnetic radiation. A cylindrical lens can be employed for this purpose.

In a third embodiment of this invention the step of generating electromagnetic radiation generates a focussed beam of electromagnetic radiation comprised of at least one spot. A spot generating phase mask in combination with a Fourier transforming lens can be employed for this purpose.

In a fourth embodiment of this invention the step of generating electromagnetic radiation generates a substantially uniform electromagnetic radiation field, and the step of directing includes a step of applying an apertured mask to the surface for selectively passing a portion of the field through at least one opening within the mask. An ultraviolet (UV) lamp can be employed to generate the illumination.

An advantage provided by this invention is an improvement over conventional techniques for patterning glass.

BRIEF DESCRIPTION OF THE DRAWINGS

The above set forth and other features of the invention are made more apparent in the ensuing Detailed Description of the Invention when read in conjunction with the attached Drawings, wherein:

FIG. 2b is a profile of the channel shown in FIG. 2a.

FIG. 3 is a contact AFM topographic image of a series of lines produced in SK5 glass substrate using a X-Y positioning stage.

FIG. 4b is a profile of one of the holes illustrated in FIG. 4a.

FIG. 9b is a profile of the groove shown in FIG. 9a.

FIG. 11a is an enlarged cross-sectional view of a terminal portion of an optical fiber.

FIG. 11b is an enlarged elevational view of an optical waveguide structure disposed on a substrate.

FIGS. 12a and 12b are an enlarged cross-sectional and top view, respectively, of an annular three-dimensional feature fabricated in accordance with this invention.

FIG. 13 is an enlarged elevational view of a substrate having a channel formed therein, the channel being filled with a desired material.

DETAILED DESCRIPTION OF THE INVENTION

Figure 1:
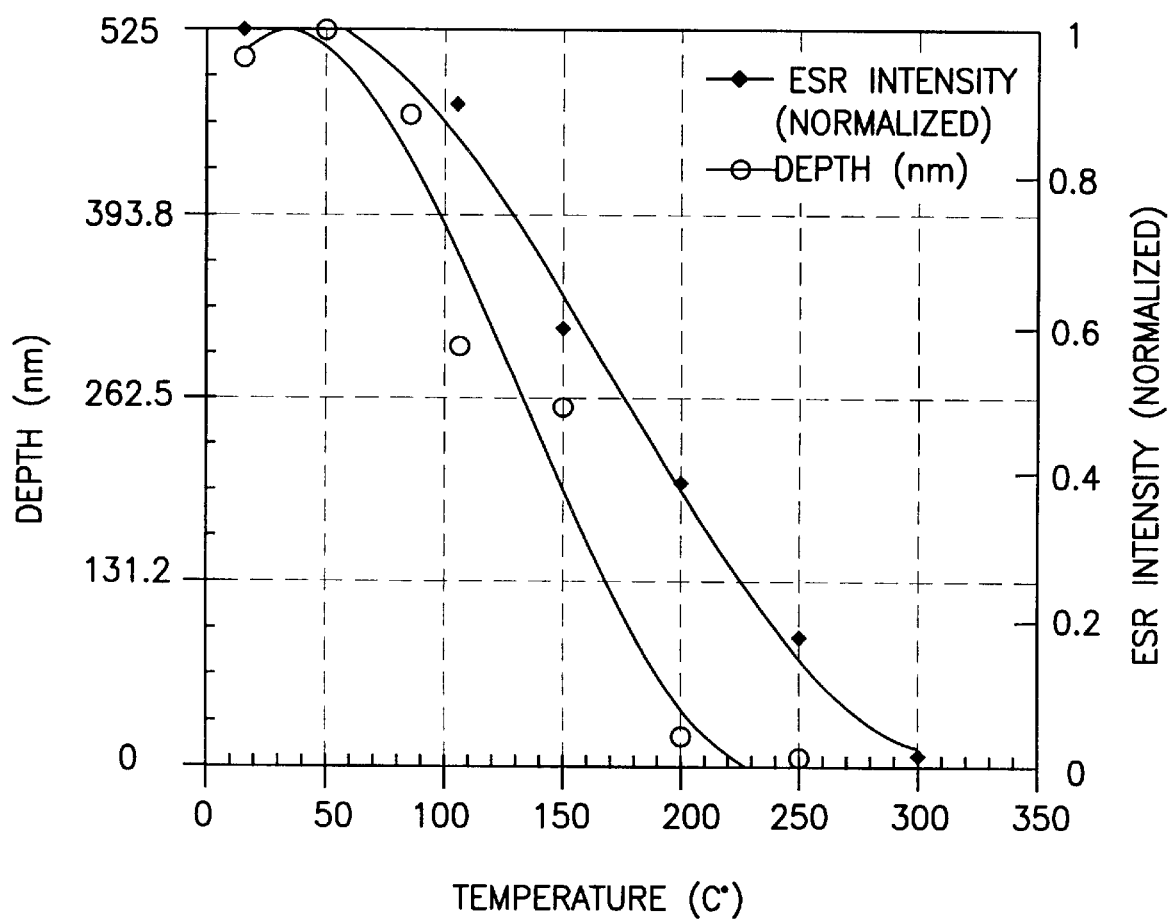
FIG. 1 is a graph illustrating a measurement of the selective etching depth and ESR intensity data of boron E' centers in borosilicate glasses at various annealing temperatures. The selectively etched depth relative to the unexposed background etched surface was measured using contact AFM in the topographic mode. Each sample was pre-exposed and annealed for 10 minutes at various temperatures and subsequently etched.

The ensuing description discloses, relative to Examples 1–5, a novel micrometer-scale maskless photoetching process that is applicable to a large variety of silicate-based transparent glasses. The Example 6, and FIG. 8, disclose an embodiment of the photoetching process that employs a mask for selectively illuminating the silicate-based transparent glass.

EXAMPLE 1

In a first exemplary embodiment of this invention a direct exposure of a glass substrate is made to 532-nm 74-ps (FWHM) pulses from a frequency-doubled mode-locked (76-MHz) and Q-switched (1-kHz) Nd:YAG laser. The FWHM of the Q-switch switch envelope is 125 ns, with each envelope containing nine mode-locked pulses. The input beam was the lowest-order Gaussian mode. The glass substrate was exposed for periods of several tens of seconds to the laser beam, which translates to an exposure of several hundred thousand laser pulses during the optical exposure (encoding) time of the glass substrate. The power densities were of the order of a few gigawatts per square centimeter. After the exposure no damage of the surface of the glass substrate could be observed by examination with an optical microscope. Following exposure, the glass substrate was etched in a 12% aqueous solution of hydrofluoric acid for 15 min in an ultrasonic bath. The topography of the etched glass surface was studied by use of contact atomic-force microscopy. Five different types of silicate-based glass (borosilicate, lead glass, fluoride glass, barium glass, barium lead glass), as well as pure silica, were examined using this method. The approximate chemical compositions (in wt. %) of these glass substrates is given in Table 1.

TABLE 1

| Glass Type | | $SiO_2$ | $B_2O_3$ | $Al_2O_3$ | $Na_2O$ | $K_2O$ | CaO | BaO | ZnO | PbO | $KHF_2$ |
|---|---|---|---|---|---|---|---|---|---|---|---|
| Borosilicate | BK7 | 69.6 | 9.9 | — | 8.44 | 8.4 | 0.1 | 2.54 | — | — | — |
| Fluoride | FK5 | 56.9 | 15.7 | — | — | 5.6 | — | — | — | — | 21.6 |
| Lead | LLF2 | 63.2 | — | — | 5.0 | 8.0 | — | — | — | 23.5 | — |
|  | F8 | 50.2 | 0.4 | — | 3.8 | 5.6 | — | — | — | 39.7 | — |
| Barium | SK5 | 38.7 | 15.0 | 5.0 | — | — | — | 40.1 | — | — | — |
| Barium/lead | BaF4 | 45.5 | — | — | 0.5 | 7.3 | — | 15.8 | 8.0 | 22.5 | — |

Although the etched surface topography differed, depending on the chemical composition of the glass, among the foregoing glasses only those containing boron showed selectively etched patterns in accordance with an aspect of this invention. In all glasses that selectively etched the etch region was always found to be significantly smoother than the unexposed glass material. Pure silica, like other non-borosilicate glasses, failed to produce selective etching after laser exposure. An examination was made of the resulting etch pattern after exposure to a solid Gaussian beam focused to a 70-$\mu$m diameter spot at the $1/e^2$ of the intensity. The etch pattern revealed that the glass substrate is etched away in a ring, and not at the center of the spot, where the beam intensity is a maximum. This result differs from what would be expected if laser-induced damage of the glass substrate were to used to produce microstructures. As will be discussed below, it was also found that either pre-annealing or post-annealing (relative to exposure) of the borosilicate glass substrate resulted in an absence of selective etching.

It should be noted that the use of equivalent average powers from a cw argon-ion laser operating at 514 nm did not result in selective etching of the glass substrate, implying that a higher-order multiphoton absorption process is required to condition or encode the glass for subsequent etching.

The origin of the difference in etching rate between exposed and unexposed regions is believed to be due to the presence of a differential charge carrier diffusion process, coupled with trapping of charge carriers (e.g., electrons) at certain sites. The overall charge distribution is believed to result from the diffusion and recombination of charge carriers excited by a two-photon process from midgap states of the glass.

In order to further elucidate the nature of the trap sites responsible for selective etching, thermal annealing processes were conducted to compare the saturated differential depth of the selectively etched area to published ESR data for boron E' centers at various temperatures. The resultant data is depicted in FIG. 1, and shows a strong correlation between the two measured quantities. The similarity in the behavior of the thermal annealing depletion of the boron E' centers and the selective etching depth offers strong evidence that the boron E' centers are the charge carrier trap sites in this process.

Having thus described the first exemplary embodiment of this invention, a description is now made of a second exemplary embodiment that includes an improved etching procedure and a post-etch polishing procedure.

EXAMPLE 2

Figure 5:
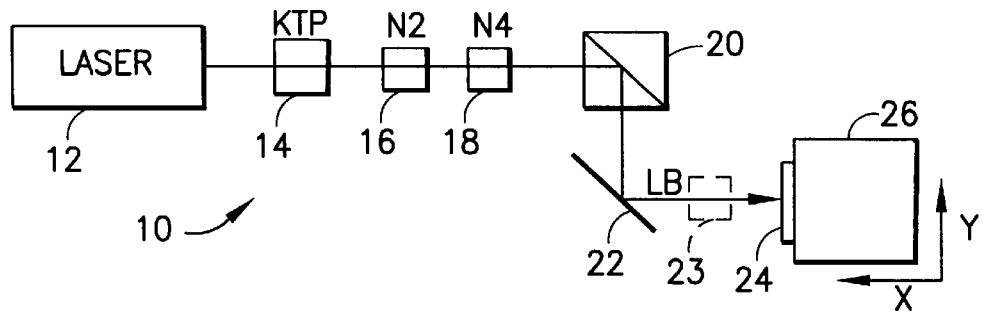
FIG. 5 is a block diagram of a first embodiment of a system for selectively optically patterning a glass substrate in accordance with this invention.

Referring now to FIG. 5, there is illustrated an optical exposure system 10 that is suitable for practicing various embodiments of this invention. The second embodiment of the invention, for maskless patterning of a glass-based substrate, directly exposes a substrate 24 that is comprised of optically polished borosilicate glass, containing at least 10% by weight borate content (e.g., commercially available SK5 glass from Schott Corp.), to focused pulses of 532 nm laser light from a frequency doubled, model locked (76 MHz), Q-switched Nd:YAG laser 12. A KTP crystal 14 is employed to generate the 532 nm (green) pulses from the 1.064 $\mu$m output of the Nd:YAG laser 12. By example, the pulse width of the modelocked pulses and the Q-switch envelope were 120 ps and 125 ns, respectively, with each Q-switch envelope containing ten pulses. The amount of average laser power used to exposed the glass sample 24 was controlled by dual waveplates ($\lambda/2$ and $\lambda/4$) 16 and 18 and a beamsplitting polarizer 20. The 1.064 $\mu$m output was rejected using a dichroic mirror 22. The glass substrate 24 was mounted onto an X-Y stage 26, thereby enabling direct patterning with a fixed laser beam (LB). Alternatively, relative motion between the laser beam and the surface of the glass substrate 24 can be achieved by scanning the laser beam over the surface while keeping the glass substrate immobile. A combination of substrate and laser beam motions can also be employed.

The block designated as 23 represents additional optical components that can be inserted into the beam as described below. These additional optical components can include one or more of the following exemplary optical components: a Fourier transforming lens; a spot generator phase mask; a cylindrical lens; and an objective lens.

After exposure to the intense 532 nm light (e.g., peak intensities between 1 to 20 GW/cm$^2$), the glass substrate 24 shows no visible evidence of encoding until placed into the etching solution.

Figure 6:
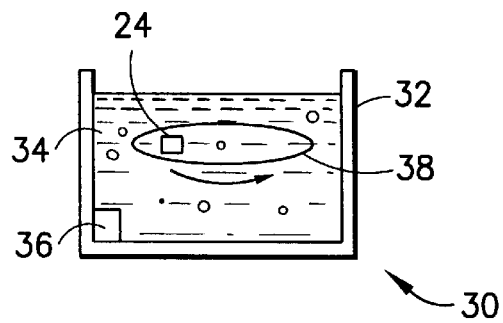
FIG. 6 is a simplified cross-sectional view of apparatus for etching the glass substrate of FIG. 5.

Reference is now made to the preferred etching arrangement 30 shown in FIG. 6. In this embodiment of the invention, and unlike the previously described method of dipping the exposed glass substrate 24 into a 12% aqueous solution of hydrofluoric acid, which was found may result in inhomogeneous etching due to surface build-up of reaction products, the substrate 24 is instead placed onto a rapidly rotating mount 38 (3000 rpm). The rapidly rotating substrate 24 is suspended within a tank 32 containing a bath 34 of hydrofluoric acid solution. The entire bath may be ultrasonically agitated using a suitable ultrasonic transducer 36. The resulting turbulent flow of the hydrofluoric acid solution over the optically exposed glass substrate 24 eliminates the surface build-up of insoluble byproducts of the chemical etching reaction and results in significantly deeper selective etching. A dramatic difference in the etched surface characteristics is observed after the spin-agitated etching (SAE) treatment shown in FIG. 6. Most notably, there is an enhancement of the level of saturation of the selective etching rate, as well as an increase in the uniformity of the etched surface roughness within those regions not exposed to the laser light. By example, when using only the ultrasonic etching process atomic force microscopy reveals that the maximum depth of the selectively etched region is approximately 250 nm; while, when using the SAE treatment procedure of FIG. 6, surface structures with depths exceeding 3 $\mu$m are produced.

Because the feature depths obtainable using the SAE treatment are significantly deeper than those produced using only the ultrasonic etching treatment, the substrate 24 may be subsequently re-polished with a slush mixture comprised of, by example, 0.3 $\mu$m alumina particles in water, to remove the rough background surface features. A manual or automatic polishing step comprising about 10–15 small circular motions over the alumina slush is typically sufficient to remove the background features.

EXAMPLE 3

Figure 2A:
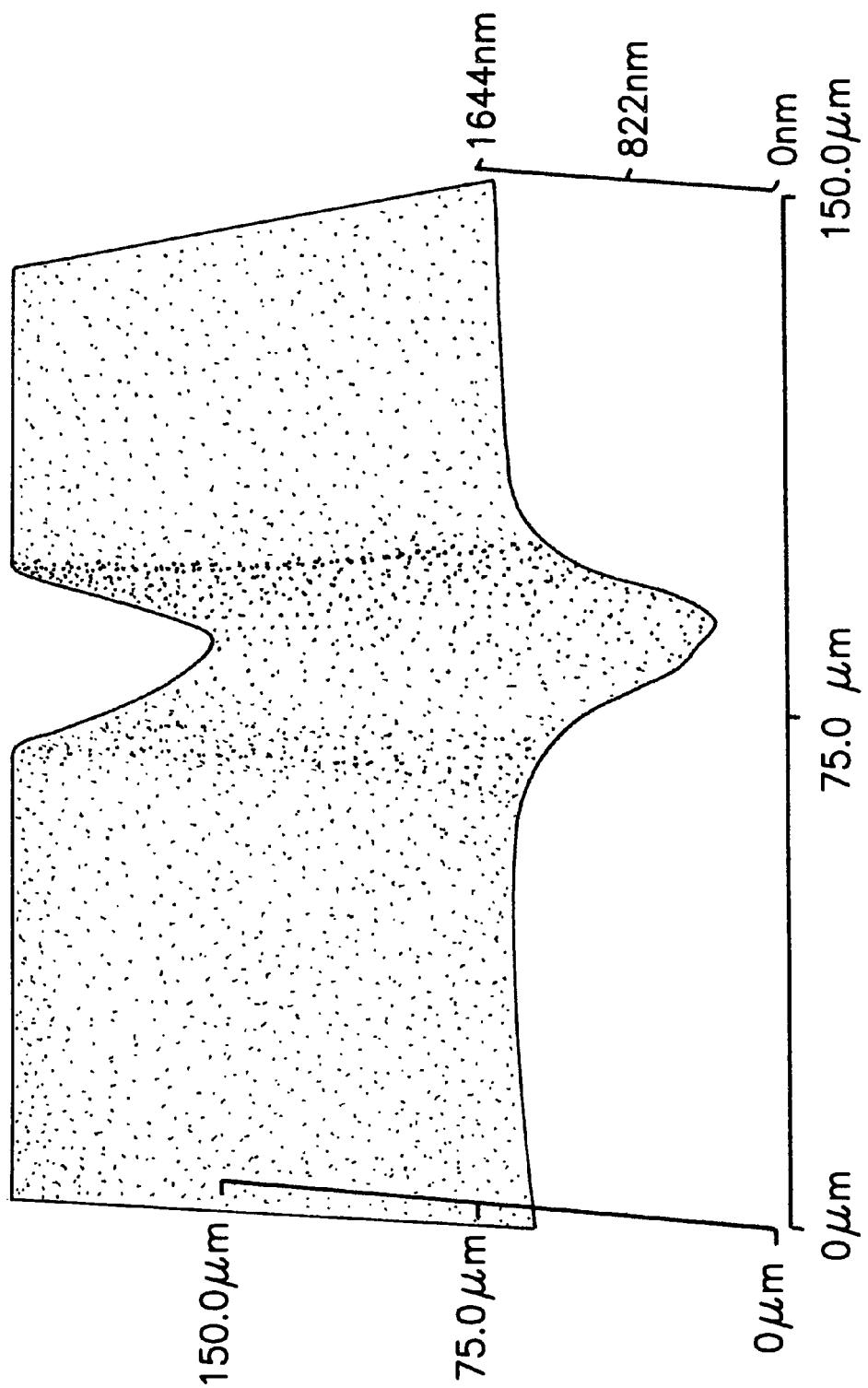
FIG. 2a is a contact AFM topographic image of a channel fabricated on a SK5 glass substrate.
Figure 2B:
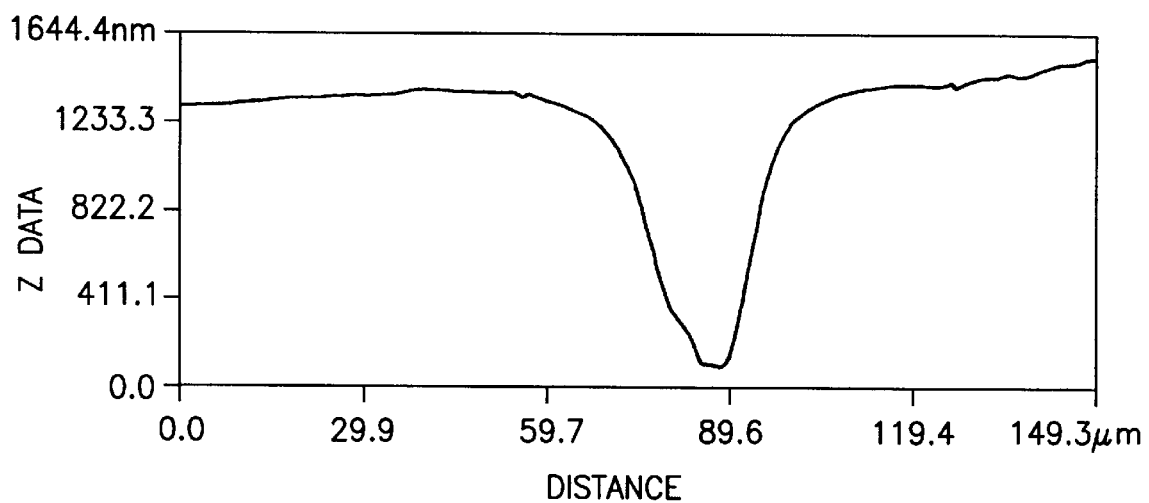

As a further example of the application of the teaching of this invention, FIG. 2a shows a contact atomic force microscope (AFM) image of a selectively etched groove or channel that is approximately 27 $\mu$m wide and 1.2 $\mu$m deep. FIG. 2b shows a profile of the same channel. The channel structure was patterned by propagating a Gaussian beam through a cylindrical lens and placing the SK5 glass substrate 24 at the focus of the resulting line. The exposed sample was subsequently etched using the SAE method for 30 minutes in a 12% aqueous hydrofluoric acid solution. It has been found that the selectively etched region is deeper with longer etching times, however, the width of the structure also broadens after prolonged etching. Despite this effect, an etching time of approximately 30 minutes does not show an appreciable widening of the channel, as compared to a similarly prepared glass substrate 24 that is etched for a shorter time.

EXAMPLE 4

The two-axis positioning stage 26 was employed to draw a series of parallel lines on the glass substrate 24 using a 43× objective lens. The substrate 24 was translated back and forth across the beam focus. In order to increase the pulse flux through the glass substrate, the Q-switch rate of the laser 12 was increased from 1 kHz to 7 kHz with a resulting average power of 15 mW. The resulting pattern, after the SAE treatment described above with reference to FIG. 6 and the subsequent polishing step, is shown in FIG. 3. The lines produced were 20 $\mu$m apart and had dimensions of 6 $\mu$m in width and 300 nm in depth. The unexposed portions of the substrate surface exhibited a roughness of 10–18 nm. The depth and secondary surface roughness of these lines, prior to polishing, were measured to be 600 nm and approximately 100 nm, respectively.

EXAMPLE 5

Figure 4B:
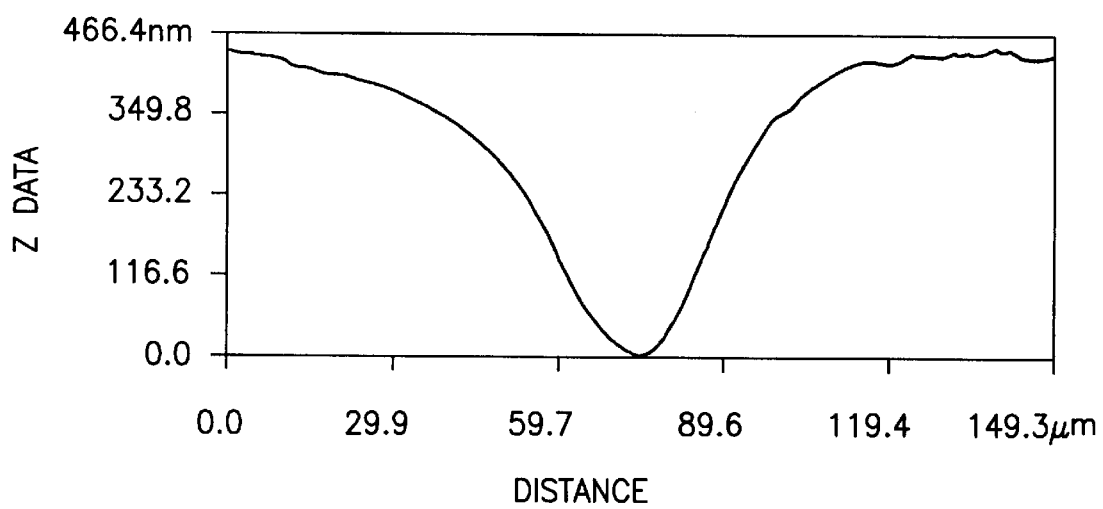
Figure 4A:
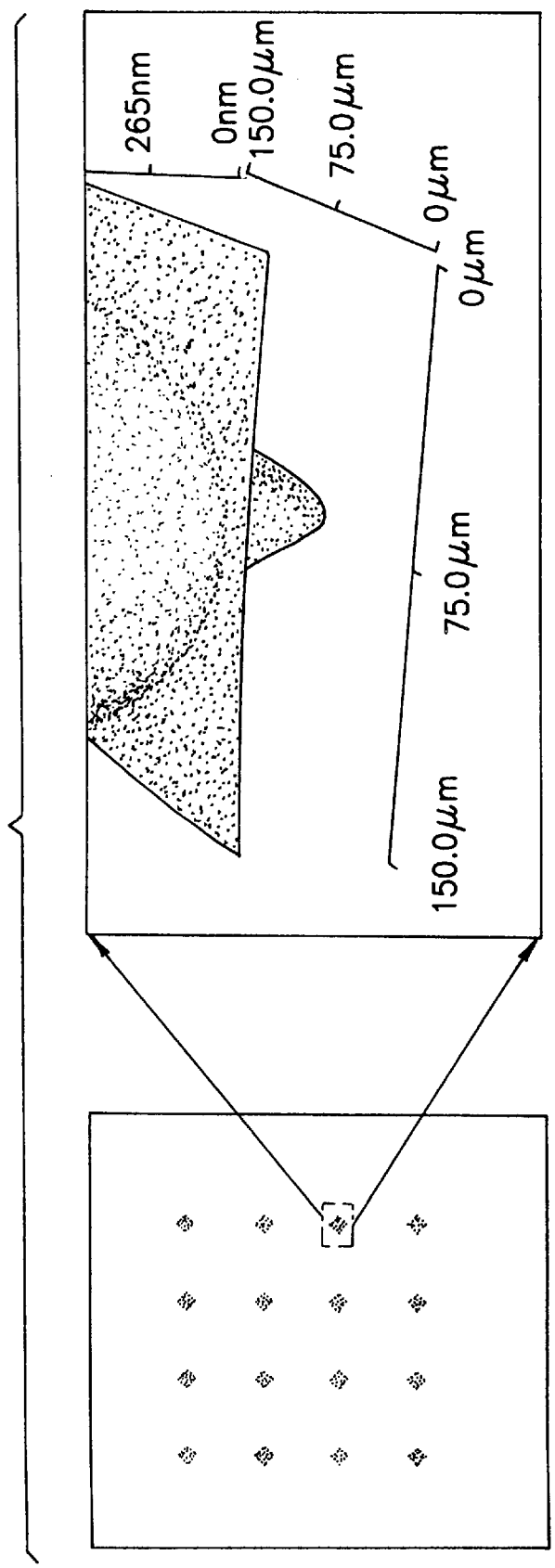
FIG. 4a is an optical microscope image of a 4×4 array of holes produced using a spot generator phase mask, and illustrates an enlarged view of one of the holes.

As another demonstration of the applicability of this invention to micromachining technology, a 4×4 array of holes (i.e., depressions) was produced. Each hole had an outer diameter (O.D.) of approximately 50 $\mu$m and depth of 0.47 $\mu$m. The array of holes is shown in FIG. 4a, with the enlarged portion being an AFM topographic image. FIG. 4b illustrates a profile of one of the holes. The holes were fabricated using a conventional spot generator phase mask that produced 16 Gaussian spots of equal intensity from a single Gaussian beam at the focal point of a Fourier transforming lens. The average laser power used was 750 mW, resulting in approximately 47 mW per spot (i.e., 750 mW/16 spots). The exposed glass substrate was etched for 15 minutes using the SAE treatment of FIG. 6 to produce the array of holes. Holes with diameters ranging from 14 $\mu$m O.D. to 50 $\mu$m O.D. may be fabricated, depending on position of the glass substrate 24 relative to the focus of the Fourier transforming lens. That is, when the surface glass substrate 24 is positioned away from the focal plane of the lens the spot diameter, and the resulting hole diameter, is increased.

It should be appreciated by those skilled in the art that the teaching of this invention can be applied to advantage in a number of different applications. For example, etched structures with dimensions in excess of several tens of microns in width and several microns in depth are particularly suitable for performing ultra-high speed capillary electrophoresis, where channel sizes of this order are required. The microfabrication methods and apparatus of this invention can also be employed in the area of diffractive optics as well. The ability to create line features of the order of one micron, in combination with the SAE and repolishing techniques, can produce optical quality surface features for diffractive optical elements. Furthermore, the direct writing of phase masks that have feature resolutions of 5×5 $\mu$m$^2$ and heights of 500 nm can be realized and implemented by using a computer controlled X-Y translation stage 26. With the addition of an automated SAE and repolishing system, the entire process can be used to provide, by example, a rapid prototyping capability for diffractive optics. For integrated optics, the layout for an all optical-switch microchip can be written directly onto a glass wafer in a single step. By spin-coating the processed (SAE and polished) chip with photoresist, that has a higher index of refraction than the glass wafer, and subsequently baking the photoresist, fully integrated optical microchips can be rapidly fabricated in glass.

Figures 7A, 7B:
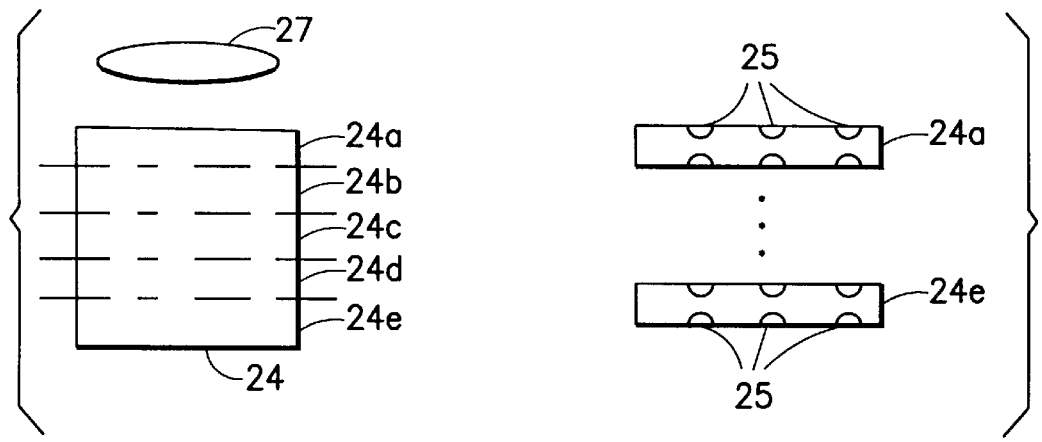
FIG. 7a is a side view of a glass substrate that has been patterned in accordance with the system of FIG. 5.
FIG. 7b illustrates the glass substrate of FIG. 7a after slicing and etching.

Furthermore, since the microfabrication technique of this invention utilizes a multi-photon process to encode patterns in borosilicate glasses, where the linear absorption of the encoding electromagnetic radiation is practically negligible, the entire pattern is encoded throughout the thickness of the glass substrate. By example, the linear absorption length of the laser beam in the glass substrate 24 at 532 nm is approximately 10 cm. Thus, the optical encoding is present throughout, by example, a one centimeter thick substrate. Referring to FIG. 7a, by directly writing patterns onto a glass substrate 24 whose thickness is much smaller than the Rayleigh length of the focusing lens 27, multiple copies of the pattern can be obtained by slicing the substrate 24 (typically in a direction that is generally parallel to the previously illuminated surface) into two or more thin slabs (by example, slabs 24a–24e). Each of the slabs 24a–24e can then be etched and optionally polished on one or both surfaces to provide a plurality of substantially identical thinner glass substrates having the desired surface features 25, such as channels, grooves, or holes. This capability is important for large scale production of glass-based devices in which the parallel nature of the encoding process can significantly reduce the processing time.

Figure 8:
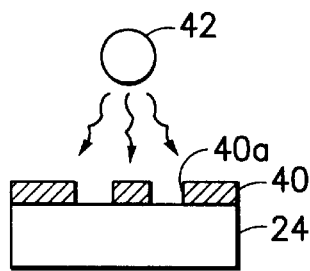
FIG. 8 is a block diagram of a second embodiment of a system for selectively patterning a glass substrate in accordance with this invention.

Reference is now made to FIG. 8 for illustrating a further embodiment of this invention. The borosilicate glass substrate 24 (e.g., SK5) is coated with a UV-opaque mask 40 containing apertures 40a. A UV source 42 is positioned for blanket illuminating the masked substrate 24, and thus encodes the substrate regions exposed through the mask apertures 40a. Processing continues to remove the mask 40, and to then selectively etch away the exposed portions of the substrate 24. The above-described SAE treatment (FIG. 6) is presently preferred for removing the substrate material.

EXAMPLE 6

Figure 9A:
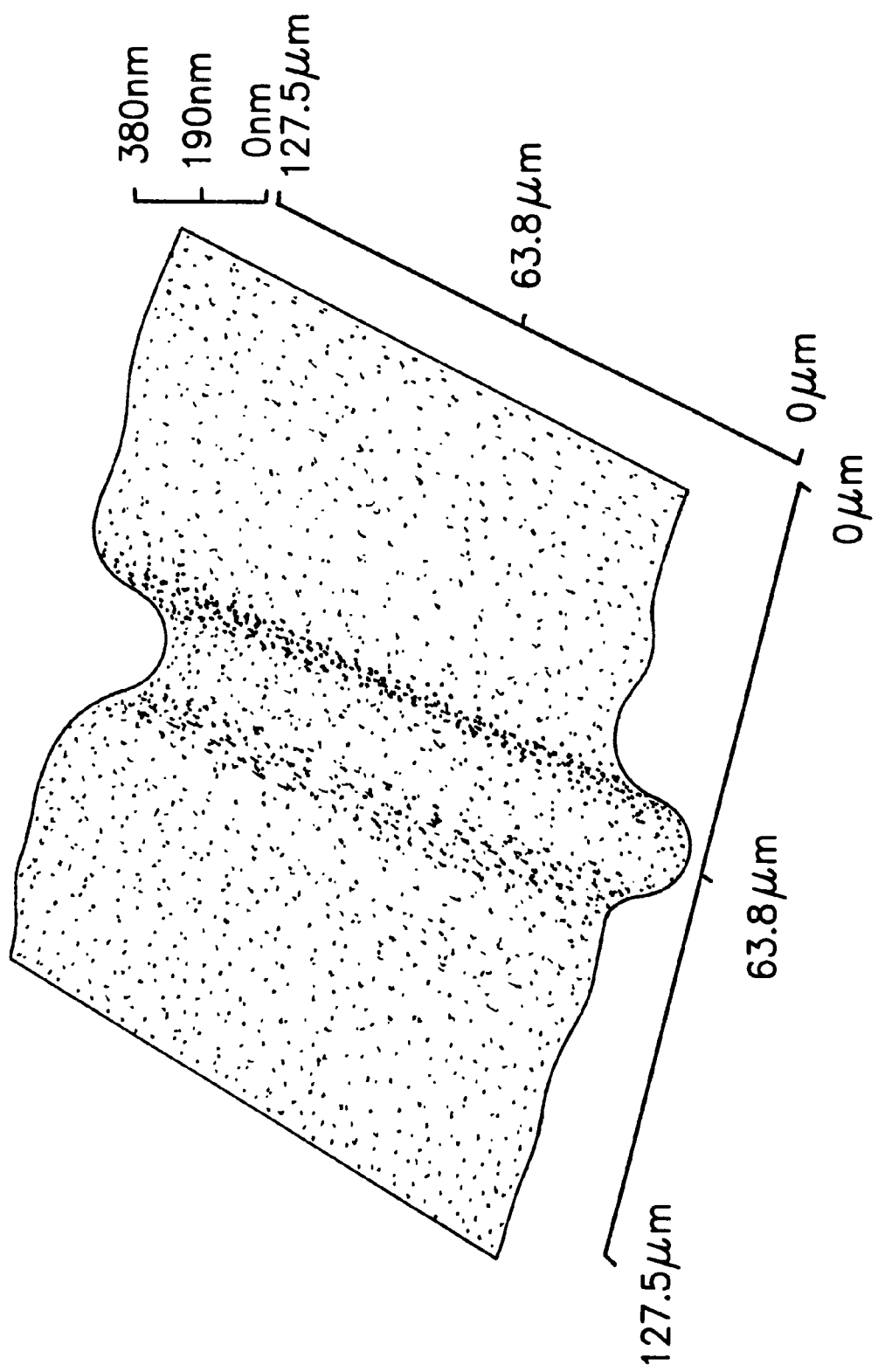
FIG. 9a is a contact AFM topographic image of a groove fabricated on a SK5 glass substrate using the embodiment of FIG. 8.
Figure 9B:
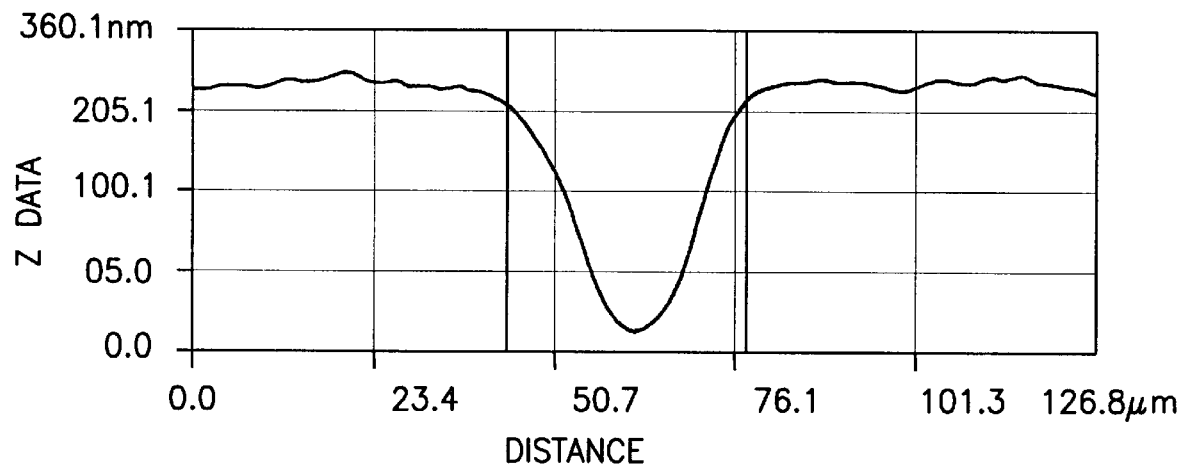

An opaque (e.g., aluminum) mask 40 comprising 35 $\mu$m wide linear apertures 40a was placed on the surface of a SK5 substrate 24 using a standard photolithographic technique (a mask template on an intervening transparent quartz substrate may also be used). The masked substrate was then exposed to UV light from a UV lamp (8.5×10$^{-2}$ W/cm$^2$) positioned one centimeter from the surface of the mask. The substrate 24 was exposed to the substantially uniform electromagnetic energy field for approximately one minute, after which the mask 40 was removed using a phosphoric acid solution. After etching the exposed substrate 24 for 10 minutes using the SAE process the depth of the etched lines was found to be approximately 0.5 $\mu$m. The substrate 24 was then polished to remove secondary background roughness features and examined using an atomic force microscope (AFM) in the contact topographic mode. One of the lines produced using this technique is shown in FIG. 9a, while the corresponding profile is illustrated in FIG. 9b. The width and depth of the line are 34 $\mu$m and 290 $\mu$m, respectively. With a more intense UV light source, deeper selectively etched features can be obtained. In general, the absorption length of glasses that exhibit the multi-photo encoding effect, at 255 nm, is approximately 1 mm. Feature sizes in the order of one micron can thus be produced in these glasses and, in contradistinction to conventional UV-responsive glasses, these glasses (e.g., borosilicate glasses) are suitable for high resolution patterning.

Figure 10:
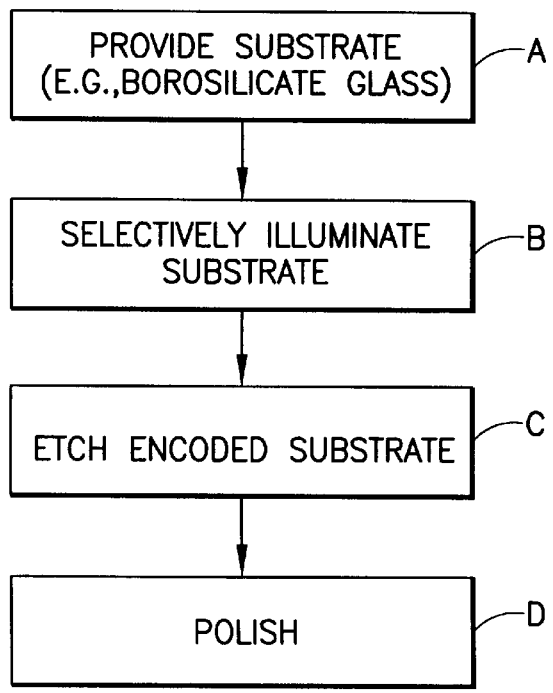
FIG. 10 is a process flow diagram in accordance with this invention.

Reference is now made to the process flow diagram of FIG. 10 for illustrating a method in accordance with this invention for selectively removing material from a substrate.

A first step (A) provides a substrate 24 comprised of a material that is capable of trapping charge carriers at sites in response to illumination with electromagnetic radiation having wavelengths within a predetermined range of wavelengths. A borosilicate glass is one presently preferred embodiment of a material, but the teaching of this invention is not limited to only this one glass.

A second step (B) selectively illuminates at least one portion of a surface of the substrate whereat it is desired to remove a portion of the material. The step of selectively illuminating includes the steps of generating electromagnetic radiation having wavelengths within a predetermined range of wavelengths, and directing the generated electromagnetic radiation to the at least one portion of the surface.

A third step (C) applies an etchant to the surface for removing the material within the selectively illuminated portion. In a presently preferred embodiment of this invention the step of applying an etchant includes the steps of immersing the substrate in the ultrasonically agitated acid bath 34, and rotating the substrate during a time that the substrate is immersed.

A fourth (optional) step (D) of the method polishes the surface to remove surface roughness.

Although described above in the context of borosilicate glasses, in a further embodiment of this invention germanium doped glasses can be used. In one particular embodiment a glass doped with germanium dioxide ($GeO_2$) is used as a substrate material onto which a desired pattern is written. For example, and referring to FIG. 11a, there is shown an enlarged view of an end section of an optical fiber 50 having a $GeO_2$ doped core 52. A laser beam (LB) is controllably directed to the core 53 to define a desired pattern, such as a diffractive phase mask, hologram, or a microlens. After exposing the Ge-doped core 52, the core 52 is etched as described above to form the desired optical element directly into the terminal end of the fiber 50. As such, the optical fiber is provided with an integral optical element for, by example, collimating, focussing, or otherwise shaping an input or an output light beam.

In general, the teaching of this invention applies to substrates comprised of heterogenous silicate glasses, such as borosilicate glasses, germanosilicate glasses, and glasses having defect centers that provide trapping sites.

In a further embodiment of this invention, and referring to FIG. 11b, the laser beam (LB) is used to write a desired pattern onto a face of a glass-based waveguide structure 53 that is disposed on a surface of a substrate 51.

FIGS. 12a and 12b illustrate the use of this invention for forming an annular depression 54 into a surface of a glass substrate 56. By example, the width (W) of the depression 54 may be 250 nanometers, and the diameter of the resulting circular structure may one micron. The depression 54 surrounds a pedestal 58. If desired, the depression could be subsequently filled with a desired substance, such as a polymer having a non-linear optical characteristic or a high temperature superconducting (HTS) material.

FIG. 13 illustrates an embodiment of this invention wherein a glass substrate 60 has at least one channel 62 formed in a surface thereof (see, for example, FIGS. 2a and 3). The channel 62 is then filled with a desired material, such as a non-linear polymer 64. An electrode 66 is formed on the substrate 60 and is biased to a desired potential with a suitable electrical source, shown schematically as a battery 68. The potential applied from the electrode 66 can be used to shift the electric field in the non-linear polymer 64. By examining an optical emission from the polymer 64, the field strength can be determined in a particular region of the structure.

It can be appreciated that a similar technique can be used to form micro-channels or micro-pipettes for use in electrophoresis apparatus. In this case the channels contain a sample of a liquid material that is desired to be separated and/or analyzed.

Figure 14A:
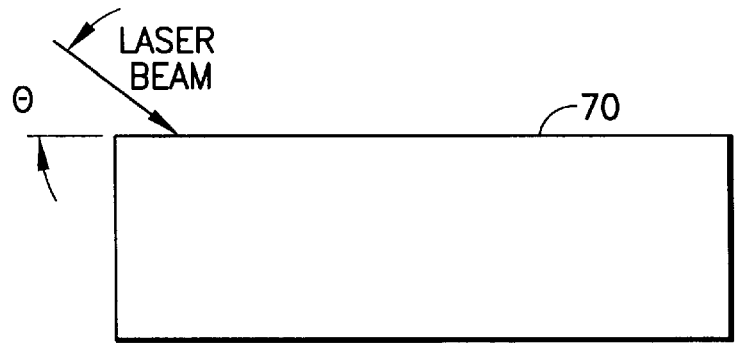
FIG. 14a and 14b are enlarged cross-sectional views of a substrate and a fabricated blazed grating, respectively, in accordance with this invention.
Figure 14B:
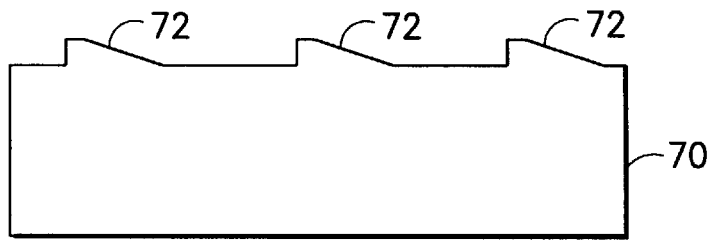

FIGS. 14a and 14b show an embodiment of this invention wherein the writing laser beam is directed at a non-normal angle θ to the surface of a glass substrate 70. By controllably scanning the laser beam portions of the surface are exposed and, after etching, form the ridged features 72 shown in FIG. 14b. The resulting structure can be employed as an optical grating, such as a blazed grating.

Figure 15:
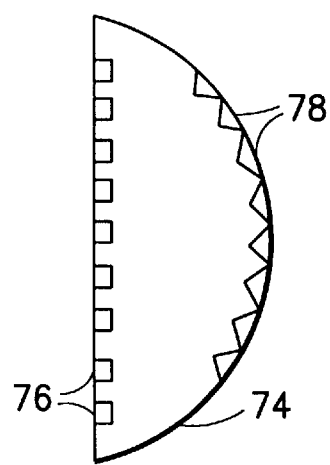
FIG. 15 is an enlarged cross-sectional view of a lens element having microfeatures fabricated in surfaces thereof.

FIG. 15 illustrates an embodiment of this invention wherein a glass-based optical element, such as a lens 74, has a plurality of features 76 formed in a first surface, and optionally a plurality of second features 78 formed in a second surface. The features 76 and 78 are fabricated so as to provide desired optical elements, such as phase masks, holographic elements, or microlenses directly within the surface(s) of the lens 74. The features 78 illustrate the possibility to define a desired pattern on a curved surface (convex as shown or concave). For example, a desired pattern can be written and subsequently etched into the cladding layer of an optical fiber.

Figure 16:
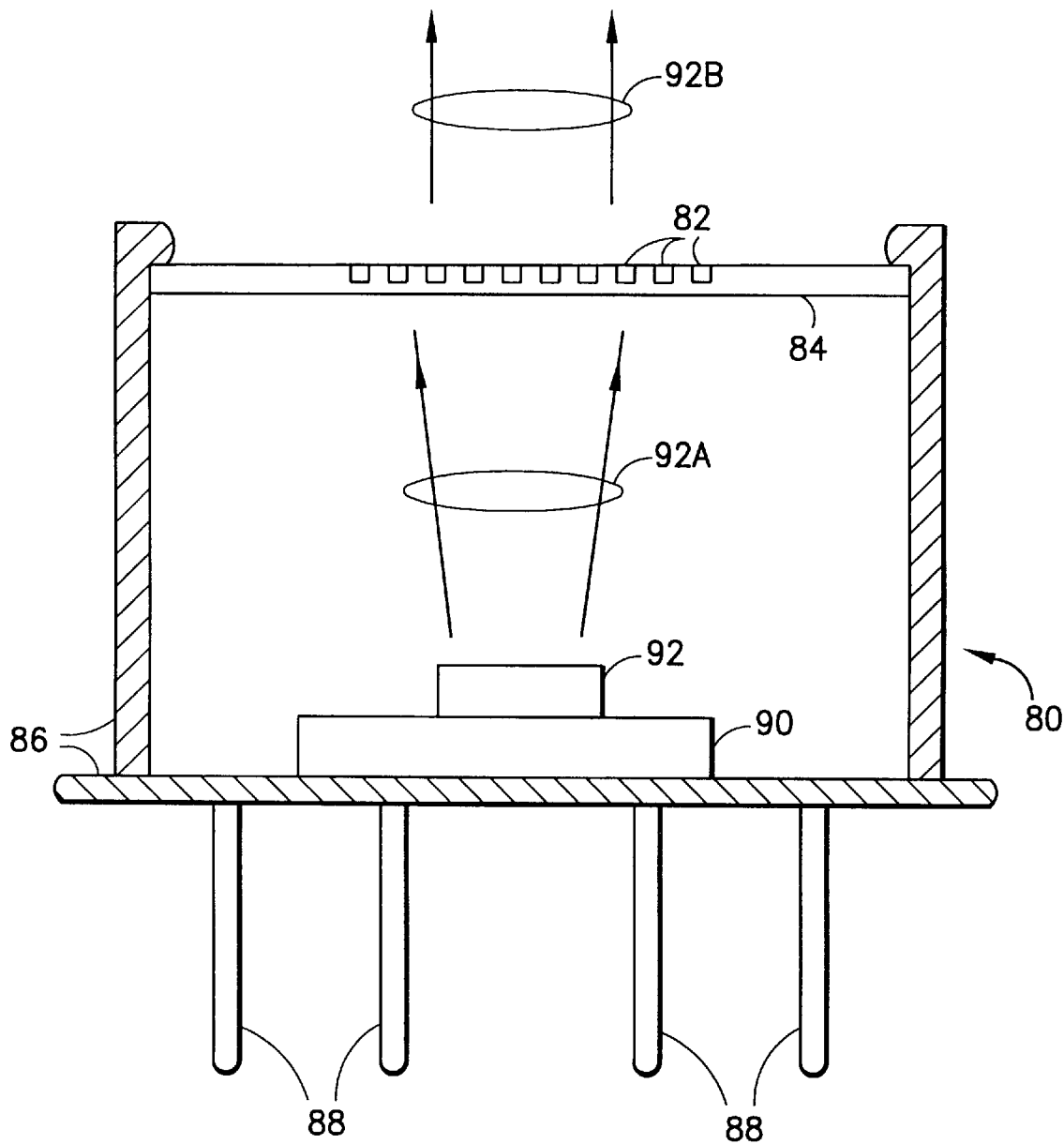
FIG. 16 is an enlarged, cross-sectional view of a laser diode package having an output window fabricated to include an optical element in accordance with this invention.

Referring now to FIG. 16, and in accordance with the teaching of this invention, there is shown a cross-sectional view of a laser diode package 80 that is constructed so as to have an integral diffractive or refractive optical element 82, such as a collimating lens, formed in an output window 84. More particularly, the laser diode package includes a conventional enclosure 86 having leads 88 for coupling to a source of operating power. Within the enclosure is a header 90 that supports a laser diode chip 92. The chip 92 emits a beam 92A of coherent radiation in a manner well-known in the art. The beam 92A has a diverging, stripe-like, non-collimated shape.

In accordance with this invention the window 84 is comprised of one of the materials described above. The entire window 84 may be comprised of this material, or only an upper portion thereof. Formed upon a surface of the window 84 is the optical element 82 in accordance with this invention. In this embodiment of the invention the optical element 82 has a shape for collimating the diverging beam 92A into a collimated beam 92B. Other lens shapes can be employed, depending on the desired beam shaping. The optical element 82 can also be formed so as to provide, by example, a phase mask, holographic element, focussing lens, etc. Combinations of these elements can also be provided.

Further in accordance with this invention, the optical element 82 can be fabricated in-situ using the apparatus shown in FIG. 5. That is, one or more of the laser diode packages 80 can be provided and then placed on the stage 26 for translating the window 84 with respect to the laser beam during the fabrication process. The beam power and/or focus can also be adjusted as required in order to arrive at the desired shape for the optical element 82. Subsequent etching of the window 84 provides the desired three dimensional structure of the optical element 82.

In any event, the material of the window 84 is selected to be substantially transparent (non-absorbing) to the output wavelength of the laser diode 92, while strongly absorbing at the wavelength of the laser 12 of FIG. 5.

Although described thus far in the context of the use of laser beam and a two photon exposure process, it is within the scope of this invention to also employ direct ultraviolet (UV) light in a single photon process.

By example, it is within the scope of this invention to provide for the UV patterning of the glass substrate using the X-Y stage 26 and a UV laser source, such as the frequency doubled output of an argon-ion laser. A particularly useful source is the 257 nm line produced by doubling the 514.5 nm line of the argon-ion laser.

It is also within the scope of this invention to simultaneously encode the glass substrate 24 with harmonic fields such as 532 nm and 1.06 $\mu$m generated in a phase matched process (e.g., a frequency doubling crystal). This phase matched process results in the formation of grating structures at the coherence length of the two fields. The period is determined by the index of refraction at $\omega$ and $2\omega$, and typically results in 10–50 $\mu$m grating structures after etching.

It should be appreciated that the teachings of this invention can be employed to realize a microfabrication method and apparatus, wherein micron and sub-micron scale three-dimensional features can be defined and constructed within a surface of a suitable substrate material, such as a borosilicate glass, a germanosilicate glass, or a glass having defect centers providing trapping sites.

In accordance with a further example, an image of a fingerprint can be digitally processed, such as by a Fourier transform, and then employed to drive the writing laser 12 so as to transfer the image to a glass substrate. After etching, the glass substrate has a three dimensional representation of the original or processed fingerprint image. The glass substrate can then be stored, and/or can be used as a tool to impress the representation of the fingerprint image into, by example, a paper or polymer blank that forms a portion of a passport, credit card, driver's license, etc. The impressed image can be subsequently sensed though optical or mechanical techniques, compared with an image of a fingerprint of the person presenting the document, and used to authenticate the identity of the person.

In another exemplary embodiment the teaching of this invention can be used to form microscopic pits or depressions that correspond to the digital data stored on a compact disk. A master disk (glass master) can be fabricated in this manner, and can be subsequently used to fabricate one or more working disk impressions (having reversed features where the depressions form raised "bumps") that are used to stamp the desired digital patterns into thousands of disks. Both music-bearing disks and data-bearing disks can be fabricated in this manner. The technique of this invention is clearly superior over conventional methods, which typically employ a photoresist-covered glass blank to form the glass master.

Near field techniques can be used to delineate sub-micron features on a suitable substrate, such as by delivering the exposure light through a fiber optic having a reduced diameter tip.

The invention has been described in the context of direct writing and non-direct writing embodiments using focussed laser beams and illumination from a lamp, respectively. The invention has also been described in the context of various specific glasses, wavelengths, powers, repetition rates and the like. It should be realized that these various parameters are exemplary of the teaching of this invention, and should not be construed in a limiting sense upon the practice of this invention.

Furthermore, the foregoing analysis of the optically induced charge carrier trapping mechanism was presented in order to aid in a qualitative understanding of this invention. While there is no intent to limit the scope of this invention by the theory presented above, this theory is believed to be accurate and consistent with observable facts and accepted scientific principles.

Thus, while the invention has been particularly shown and described with respect to preferred embodiments thereof, it will be understood by those skilled in the art that changes in form and details may be made therein without departing from the scope and spirit of the invention.

What is claimed is:

1. A method for selectively removing material from a substrate, comprising the steps of:

providing a substrate comprised of a material that is capable of trapping charge carriers at sites in response to illumination with electromagnetic radiation having wavelengths within a predetermined range of wavelengths, the material being comprised of a glass that contains boron;

selectively illuminating at least one portion of a surface of the substrate where it is desired to remove a portion of the material, the step of selectively illuminating comprising the steps of generating electromagnetic radiation having wavelengths within the predetermined range of wavelengths and directing the generated electromagnetic radiation to the at least one portion of the surface; and applying an etchant to the surface for removing the material within the selectively illuminated portion.

2. A method as set forth in claim 1, wherein the range of wavelengths includes 532 nm.

3. A method as set forth in claim 1, wherein the range of wavelengths is within the ultraviolet range.

4. A method as set forth in claim 1, wherein the step of generating includes a step of operating a laser.

5. A method as set forth in claim 1, wherein the step of generating includes a step of operating an ultraviolet lamp.

6. A method as set forth in claim 1, wherein the step of applying an etchant includes a step of immersing the substrate in an ultrasonically agitated bath, and rotating the substrate during a time that the substrate is immersed.

7. A method as set forth in claim 1, and further comprising the steps of:

slicing the substrate in a direction generally parallel to the surface to provide at least two thinner substrates; and applying the etchant to at least one surface of each of the at least two thinner substrates.

8. A method as set forth in claim 1, wherein the step of generating electromagnetic radiation generates a focussed beam of electromagnetic radiation, and wherein the step of directing the generated electromagnetic radiation includes a step of causing a relative motion between the surface and the focussed beam.

9. A method as set forth in claim 1, wherein the step of generating electromagnetic radiation generates a focussed beam of electromagnetic radiation that forms a pattern on the surface that has a generally linear shape.

10. A method as set forth in claim 1, wherein the step of generating electromagnetic radiation generates a focussed beam of electromagnetic radiation that forms a pattern on the surf ace that is comprised of at least one spot.

11. A method as set forth in claim 1, wherein the step of generating electromagnetic radiation generates a substantially uniform electromagnetic radiation field, and wherein the step of directing includes a step of applying a mask to the surface for selectively passing a portion of the field through at least one opening within the mask.

12. A method as set forth in claim 1, wherein the step of applying an etchant includes a step of immersing the substrate within a solution comprised of hydrofluoric acid.

13. A method as set forth in claim 1, and further comprising a step of polishing the surface.

14. A method as set forth in claim 13, wherein the step of polishing employs an abrasive comprised of alumina.

15. A method as set forth in claim 1, and further comprising a step of coating the surface with a material having an index of refraction that differs from the index of refraction of the substrate.

16. A method for selectively removing material from a substrate, comprising the steps of:

providing a substrate comprised of a boron-containing glass that is capable of trapping charge carriers at sites in response to illumination with electromagnetic radiation having wavelengths within a predetermined range of wavelengths;

selectively illuminating at least one portion of a surface of the substrate where it is desired to remove a portion of the material, the step of selectively illuminating comprising the steps of generating electromagnetic radiation having wavelengths within the predetermined range of wavelengths and directing the generated electromagnetic radiation to the at least one portion of the surface;

applying an etchant to the surface for removing the material within the selectively illuminated portion, the step of applying an etchant including the steps of immersing the substrate in an acid bath, and rotating the substrate during a time that the substrate is immersed; and polishing the surface to remove surface roughness.

17. A method as set forth in claim 16, wherein the step of applying includes an initial step of slicing the substrate to provide at least two thinner substrates; and wherein the step of applying applies the etchant to at least one surface of each of the at least two thinner substrates.

18. A method as set forth in claim 16, wherein the step of generating electromagnetic radiation generates a focussed beam of electromagnetic radiation, and wherein the step of directing the generated electromagnetic radiation includes a step of causing a relative motion between the surface and the focussed beam.

19. A method as set forth in claim 16, wherein the step of generating electromagnetic radiation generates a focussed beam of electromagnetic radiation that forms a pattern on the surface that has a generally linear shape.

20. A method as set forth in claim 16, wherein the step of generating electromagnetic radiation generates a focussed beam of electromagnetic radiation that forms a pattern on the surface that is comprised of at least one spot.

21. A method as set forth in claim 16, wherein the step of generating electromagnetic radiation generates a substantially uniform electromagnetic radiation field, and wherein the step of directing includes a step of applying a mask to the surface for selectively passing a portion of the field through at least one opening within the mask.

22. A system for selectively removing material from a substrate, comprising:

means for supporting a substrate comprised of a boron-containing glass that is capable of trapping charge carriers at sites in response to illumination with electromagnetic radiation having wavelengths within a predetermined range of wavelengths;

means for selectively illuminating at least one portion of a surface of the substrate where it is desired to remove a portion of the material, said means for selectively illuminating comprising means for generating electromagnetic radiation having wavelengths within the predetermined range of wavelengths, and means for directing the generated electromagnetic radiation to the at least one portion of the surface; and means for applying an etchant to the surface for removing the material within the selectively illuminated portion, comprising means for rotating the substrate in an etchant bath.

23. A system as set forth in claim 22, wherein the means for generating electromagnetic radiation comprises means for generating a focussed beam of electromagnetic radiation, and wherein the means for directing the generated electromagnetic radiation is comprised of means for causing a relative motion between the surface and the focussed beam.

24. A system as set forth in claim 22, wherein the means for generating electromagnetic radiation comprises means for generating a focussed beam of electromagnetic radiation that forms a pattern on the surface that has a generally linear shape.

25. A system as set forth in claim 22, wherein the means for generating electromagnetic radiation comprises means for generating a focussed beam of electromagnetic radiation that forms a pattern on the surface that is comprised of at least one spot.

26. A system as set forth in claim 22, wherein the means for generating electromagnetic radiation comprises means for generating a substantially uniform electromagnetic radiation field, and wherein the means for directing is comprised of a mask overlying the surface of the substrate for selectively passing a portion of the field through at least one opening within the mask.

27. An article of manufacture comprising a monolithic structure comprised of a boron-containing glass that is capable of trapping charge carriers at sites in response to illumination with electromagnetic radiation having wavelengths within a predetermined range of wavelengths, said monolithic structure having at least one optically induced region containing trapped charge carriers and that extends at least partially through a thickness of said structure, said at least one region having a characteristic etch rate that is faster than a characteristic etch rate of said glass.

28. A method of microfabrication, comprising the steps of:

selectively illuminating a surface of a glass substrate with light, the glass substrate containing boron and being capable of trapping charge carriers at sites in response to illumination with electromagnetic radiation having wavelengths within a predetermined range of wavelengths; and etching the surface to remove only those portions of the surface that were selectively illuminated, thereby forming three dimensional features in said surface.

29. A method as set forth in claim 28, and further comprising a step of selectively filling depressions within said surface with a desired material.

30. A method as set forth in claim 29, wherein said material is comprised of a non-linear optical material.

31. A method as set forth in claim 28, wherein said step of selectively illuminating illuminates an end of an optical fiber.

32. A method as set forth in claim 28, wherein said step of selectively illuminating illuminates a cladding layer of an optical fiber.

33. A method as set forth in claim 28, wherein said step of selectively illuminating illuminates an output window of an optical source.

34. A method as set forth in claim 28, wherein said step of selectively illuminating illuminates a portion of an optical waveguide.

35. A method as set forth in claim 28, and further comprising a step of forming at least one electrode on a surface of said substrate.

36. A method as set forth in claim 28, wherein said step of selectively illuminating illuminates said surface with light that is one of normal or non-normal to said surface.

37. A method as set forth in claim 28, wherein said step of selectively illuminating illuminates said surface with light having an annular pattern on said surface.

38. A method as set forth in claim 28, wherein said step of selectively illuminating illuminates said surface so as to form a representation of a fingerprint on said surface.

39. A method as set forth in claim 28, wherein said step of selectively illuminating illuminates said surface so as to form a series of depressions that encode digital data.

40. A method as set forth in claim 28, wherein said step of illuminating includes a preliminary step of providing the glass substrate to be comprised of one of borosilicate glass, a germanosilicate glass, or a glass having defect centers.

41. A method as set forth in claim 28, wherein said step of illuminating illuminates said surface with ultraviolet light.

42. A method as set forth in claim 41, wherein said step of illuminating includes a step of frequency doubling an output of a laser to generate the ultraviolet light.

43. A method as set forth in claim 28, wherein said step of illumination includes a step of illumination said surface with light having a first wavelength and with light having a second wavelength that is twice the first wavelength.

44. A method as set forth in claim 43, wherein said step of etching forms a grating structure having a period that is determined by the index of refraction of the glass at the first and second wavelengths.

45. A method as set forth in claim 28, wherein the glass is a heterogenous silicate glass.

46. A method as set forth in claim 28, wherein the three dimensional features define a phase mask.

47. A method as set forth in claim 28, wherein the three dimensional features define a diffractive optical element.

48. A method as set forth in claim 28, wherein the three dimensional features define at least one channel having dimensions suitable for use in capillary electrophoresis.

49. A method as set forth in claim 28, wherein the three dimensional features define a portion of an optical integrated circuit.

50. A method of microfabrication, comprising the steps of:

selectively illuminating a surface of a core of an optical fiber, the core being comprised of a glass doped with germanium dioxide and being capable of trapping charge carriers at sites in response to illumination with electromagnetic radiation having wavelengths within a predetermined range of wavelengths; and etching the surface to remove only those portions of the surface that were selectively illuminated, thereby forming three dimensional features in said surface.

* * * * *